United States Patent
Kyoh

(10) Patent No.: US 7,797,068 B2
(45) Date of Patent: Sep. 14, 2010

(54) DEFECT PROBABILITY CALCULATING METHOD AND SEMICONDUCTOR DEVICE MANUFACTURING METHOD

(75) Inventor: Suigen Kyoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 522 days.

(21) Appl. No.: 11/878,134

(22) Filed: Jul. 20, 2007

(65) Prior Publication Data

US 2008/0027576 A1 Jan. 31, 2008

(30) Foreign Application Priority Data

Jul. 20, 2006 (JP) .............................. 2006-198160

(51) Int. Cl.
*G06F 19/00* (2006.01)
*G06F 17/50* (2006.01)

(52) U.S. Cl. .................. 700/110; 700/109; 700/121; 716/1; 716/4; 716/16

(58) Field of Classification Search ................ 700/109, 700/110, 121; 716/1, 4, 16
See application file for complete search history.

(56) References Cited

U.S. PATENT DOCUMENTS

| | | | | | |
|---|---|---|---|---|---|
| 3,805,239 | A | * | 4/1974 | Watanabe | 382/271 |
| 4,843,631 | A | * | 6/1989 | Steinpichler et al. | 382/280 |
| 5,966,312 | A | * | 10/1999 | Chen | 703/6 |
| 6,072,588 | A | * | 6/2000 | Dohnomae | 358/1.9 |
| 6,598,210 | B2 | * | 7/2003 | Miwa | 716/4 |
| 7,076,747 | B2 | * | 7/2006 | Isobe | 716/4 |
| 7,570,796 | B2 | * | 8/2009 | Zafar et al. | 382/144 |
| 2004/0096092 | A1 | * | 5/2004 | Ikeda | 382/141 |
| 2005/0251771 | A1 | * | 11/2005 | Robles | 716/5 |
| 2007/0100591 | A1 | * | 5/2007 | Harazaki | 703/2 |
| 2007/0230770 | A1 | * | 10/2007 | Kulkarni et al. | 382/149 |
| 2007/0288219 | A1 | * | 12/2007 | Zafar et al. | 703/14 |
| 2008/0140330 | A1 | * | 6/2008 | Morioka et al. | 702/81 |

FOREIGN PATENT DOCUMENTS

| | | |
|---|---|---|
| JP | 7-302826 | 11/1995 |
| JP | 08-334888 A | 12/1996 |
| JP | 11-184064 A | 7/1999 |
| JP | 2002-261266 | 9/2002 |
| JP | 2003-023078 A | 1/2003 |
| JP | 2006-53248 | 2/2006 |

OTHER PUBLICATIONS

Notice of Reasons for Rejection mailed Oct. 28, 2008, from the Japanese Patent Office for corresponding Japanese Patent Application No. 2006-198160, and English language translation thereof.

* cited by examiner

*Primary Examiner*—Ramesh B Patel
(74) *Attorney, Agent, or Firm*—Finnegan, Henderson, Farabow, Garrett & Dunner, L.L.P.

(57) ABSTRACT

A defect probability calculating method includes assuming a plurality of process conditions containing process variations caused in a process of forming a pattern on a substrate based on a design pattern, acquiring appearance probabilities of the respective process conditions, performing process simulation to predict a pattern to be formed on a substrate based on the design pattern for each of the process conditions, determining whether the pattern predicted by performing the process simulation satisfies preset criteria for each of the process conditions, and acquiring first probability by adding together appearance probabilities of the process conditions used for process simulation of patterns which are determined not to satisfy the preset criteria.

17 Claims, 7 Drawing Sheets

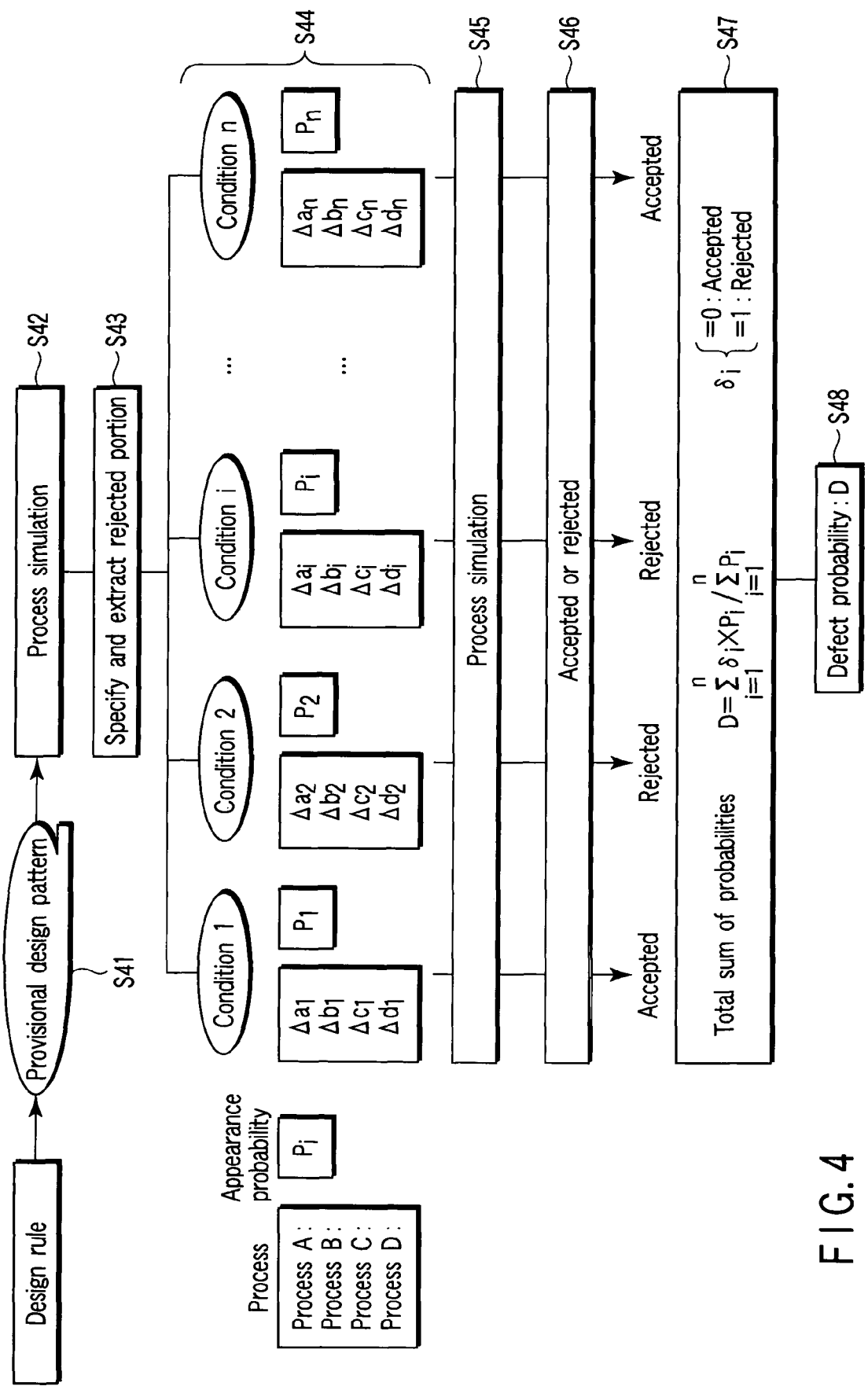
F I G. 4

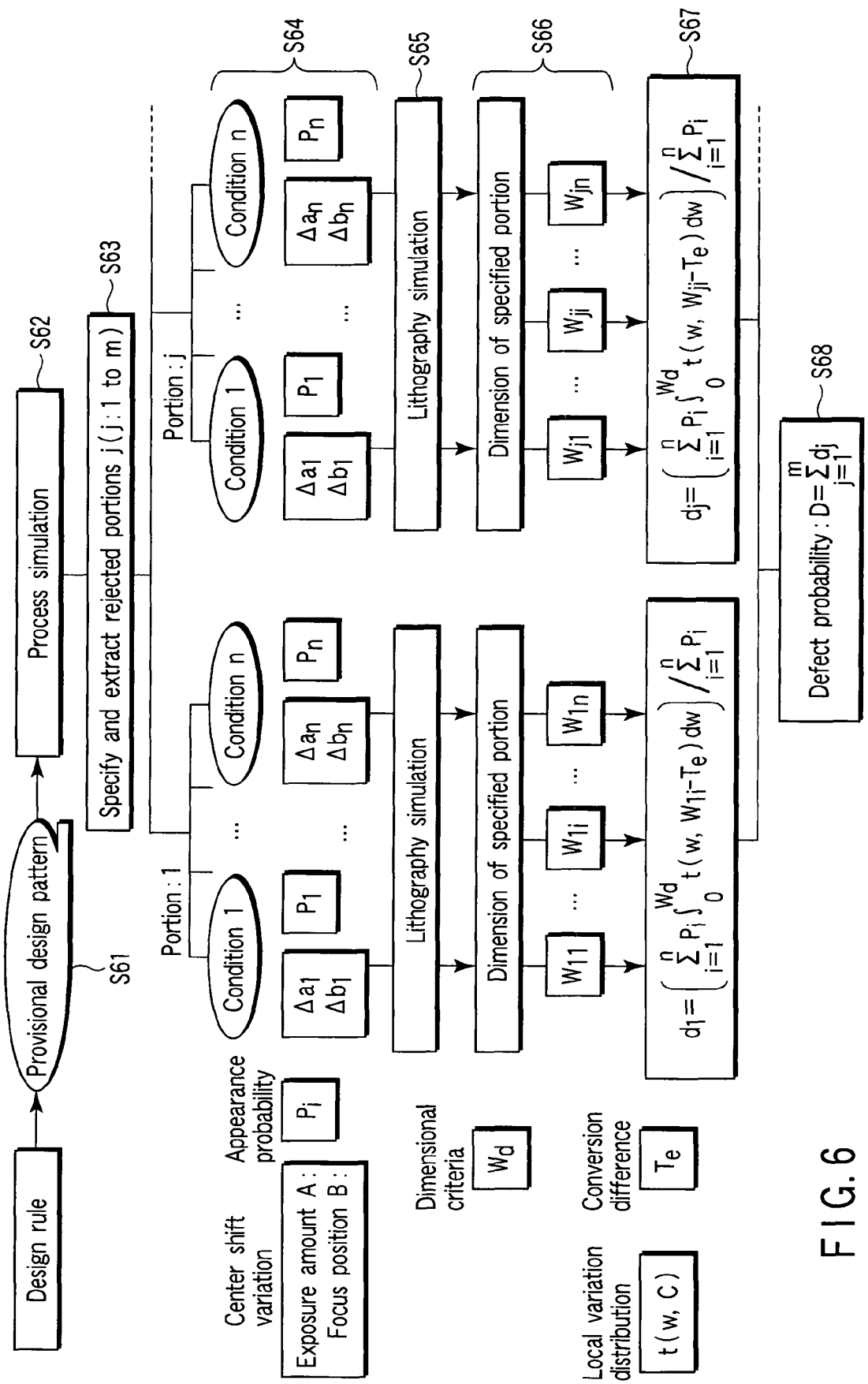
F I G. 6

DEFECT PROBABILITY CALCULATING METHOD AND SEMICONDUCTOR DEVICE MANUFACTURING METHOD

CROSS-REFERENCE TO RELATED APPLICATIONS

This application is based upon and claims the benefit of priority from prior Japanese Patent Application No. 2006-198160, filed Jul. 20, 2006, the entire contents of which are incorporated herein by reference.

BACKGROUND OF THE INVENTION

1. Field of the Invention

This invention relates to a defect probability calculating method and a semiconductor device manufacturing method.

2. Description of the Related Art

With miniaturization of semiconductor devices, it becomes more difficult to form desired circuit patterns faithful to a design pattern on a semiconductor wafer. Therefore, various proposals for forming desired circuit patterns are made (for example, refer to Jpn. Pat. Appln. KOKAI Publication No. 2006-53248).

However, conventionally, patterns in which defects occur with high possibility can be specified, but a quantitative and effective evaluation for defect probability is not made. Therefore, all of the patterns in which defects occur with high possibility must be corrected and it is difficult to efficiently correct the design pattern. Further, it is difficult to make a quantitative and effective evaluation for the manufacturing yield.

BRIEF SUMMARY OF THE INVENTION

A first aspect of the present invention, there is provided a defect probability calculating method comprising: assuming a plurality of process conditions containing process variations caused in a process of forming a pattern on a substrate based on a design pattern; acquiring appearance probabilities of the respective process conditions; performing process simulation to predict a pattern to be formed on a substrate based on the design pattern for each of the process conditions; determining whether the pattern predicted by performing the process simulation satisfies preset criteria for each of the process conditions; and acquiring first probability by adding together appearance probabilities of the process conditions used for process simulation of patterns which are determined not to satisfy the preset criteria.

A second aspect of the present invention, there is provided a defect probability calculating method comprising: dividing process variations occurring in a process of forming a pattern on a substrate based on a design pattern into a first process variation in which a central value of pattern dimensions shifts and a second process variation in which a pattern dimension varies depending on a pattern arrangement position; assuming a plurality of process conditions containing the first process variations; acquiring appearance probabilities of the respective process conditions; performing process simulation for each of the process conditions with respect to the design pattern to predict a preset pattern; acquiring a ratio at which the preset pattern predicted for each of the process conditions does not satisfy a preset dimensional condition due to the second process variation; acquiring a product of the appearance probability and the ratio for each of the process conditions; and acquiring first probability by adding together the products acquired for the respective process conditions.

BRIEF DESCRIPTION OF THE SEVERAL VIEWS OF THE DRAWING

FIG. 4 is a flowchart showing a defect probability calculating method according to a second embodiment of this invention.

FIG. 6 is a flowchart showing a defect probability calculating method according to a fourth embodiment of this invention.

DETAILED DESCRIPTION OF THE INVENTION

There will now be described embodiments of this invention with reference to the accompanying drawings.

Embodiment 1

Figure 1:
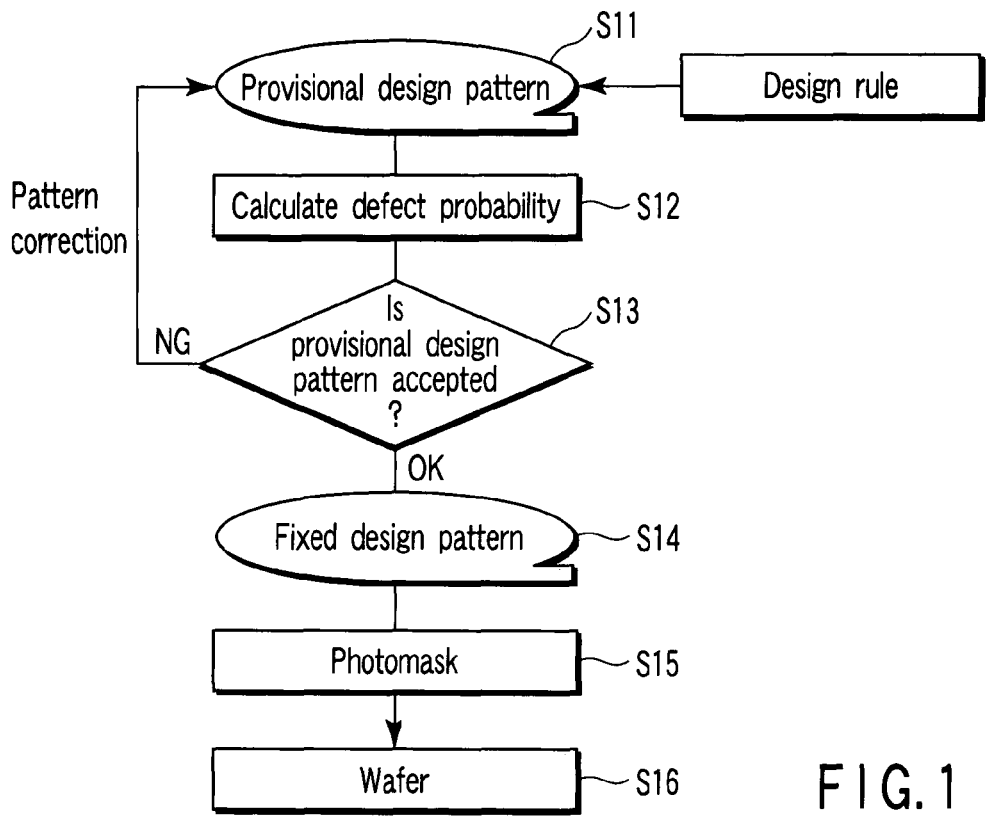
FIG. 1 is a flowchart showing one example of the basic operation in a first embodiment of this invention.

FIG. 1 is a flowchart showing one example of the basic operation of the present embodiment. The basic operation shown in the flowchart can be applied to the other embodiments.

First, a provisional design pattern (provisional design data) which satisfies the design rule is created (S11). Then, the provisional design pattern is subjected to a simulation process which will be described later to calculate defect probability (S12).

Next, whether the provisional design pattern is accepted or rejected (unaccepted) is determined based on the calculated defect probability (S13). That is, the calculated defect probability is compared with a preset value and when the defect probability is larger than the preset value, the provisional design pattern is corrected. For example, a pattern portion which causes the defect is corrected to reduce the defect probability. When the defect probability is smaller than the preset value, the provisional design pattern is determined (fixed) as a design pattern (S14).

After this, a photomask is formed based on the determined design pattern (S15). Then, a wafer process is performed by use of the formed photomask (S16). That is, a mask pattern on the photomask is transferred onto photoresist on a wafer (semiconductor substrate). Further, after the photoresist is developed to form a photoresist pattern, a conductive film or an insulating film on the wafer is etched with the photoresist pattern used as a mask.

Figure 2:
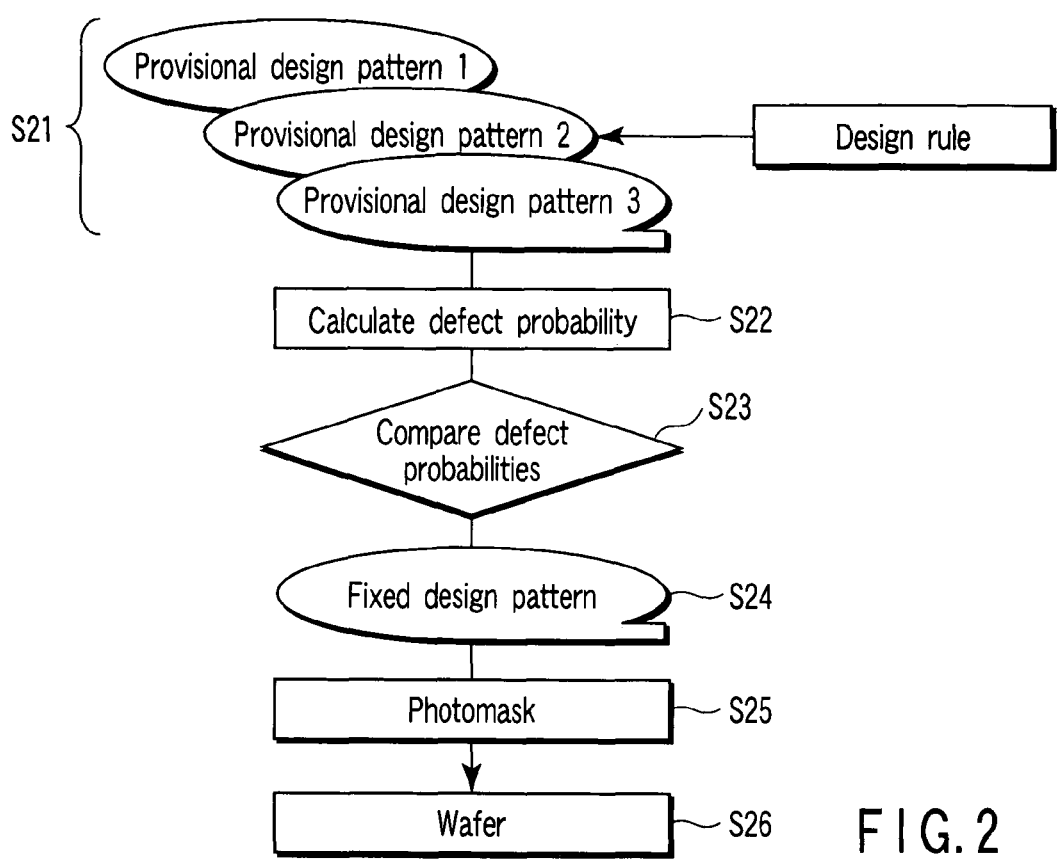
FIG. 2 is a flowchart showing another example of the basic operation in the first embodiment of this invention.

FIG. 2 is a flowchart showing another example of the basic operation in the present embodiment. The basic operation shown in the flowchart can be applied to the other embodiments.

First, a plurality of provisional design patterns (provisional design data items) which satisfy the design rule are created (S21). Then, the provisional design patterns are subjected to a process such as a simulation process which will be described later to calculate respective defect probabilities for the provisional design patterns (S22).

Next, the defect probabilities respectively calculated for the provisional design patterns are compared with one another (S23). Further, one of the provisional design patterns which has the lowest defect probability is determined (fixed) as a design pattern based on the result of comparison (S24). After this, like the case of FIG. 1, a photomask is formed based on the determined design pattern (S25) and a wafer process is performed by use of the formed photomask (S26).

Figure 3:
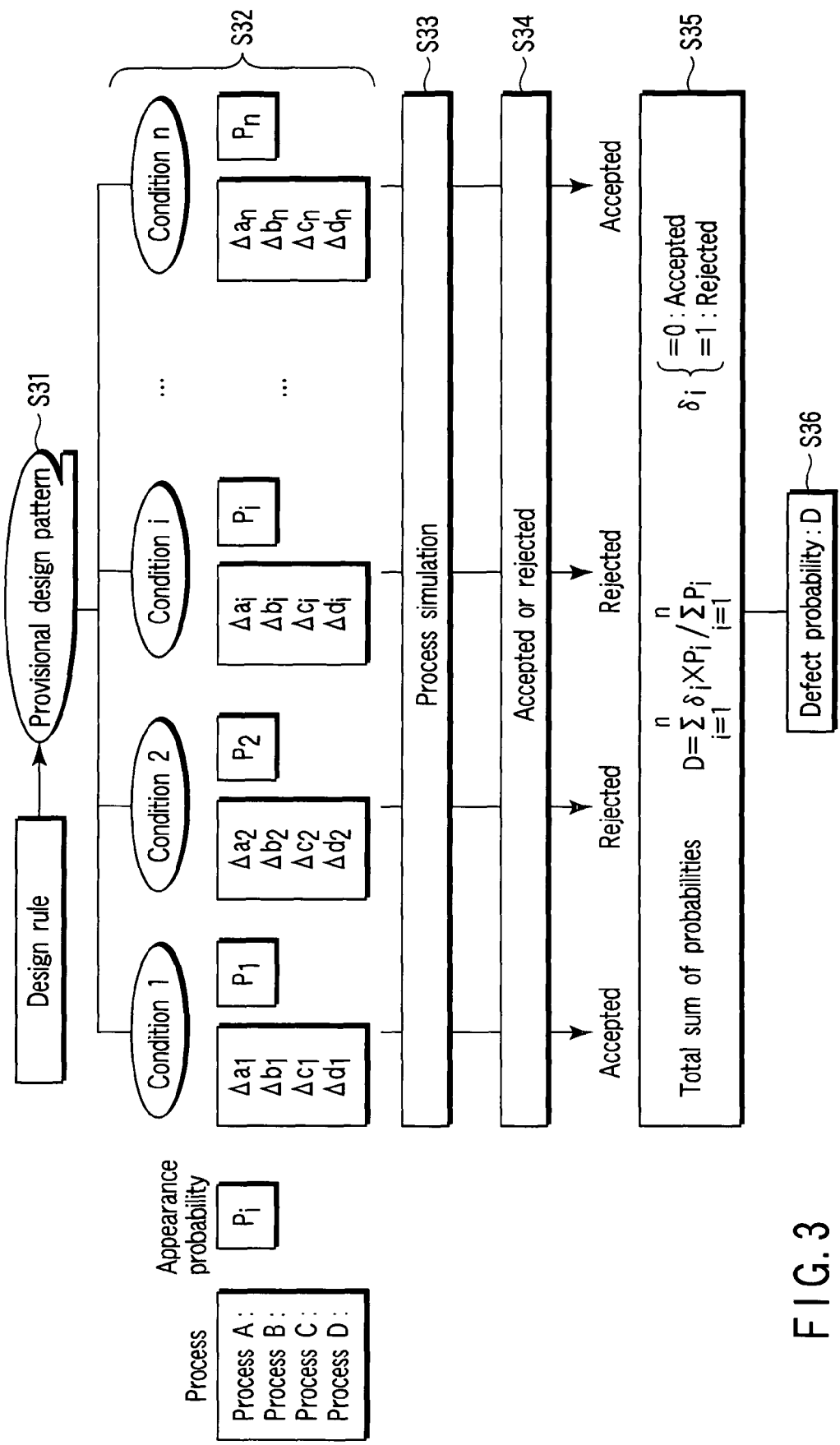
FIG. 3 is a flowchart showing a defect probability calculating method according to the first embodiment of this invention.

FIG. 3 is a flowchart showing a defect probability calculating method according to the present embodiment.

First, a provisional design pattern (provisional design data) which satisfies the design rule is created (S31).

Then, various processes (processes A, B, C, D) for forming patterns on a wafer (semiconductor substrate) based on the provisional design pattern are assumed. For example, various processes such as photolithography and etching processes are assumed. After this, process variations ($\Delta a$, $\Delta b$, $\Delta c$, $\Delta d$) occurring in the respective processes (processes A, B, C, D) are assumed. Further, a plurality of process conditions (conditions 1, 2, ..., n) containing the process variations are assumed. For example, the condition 1 is specified by the process variations ($\Delta a_1$, $\Delta b_1$, $\Delta c_1$, $\Delta d_1$) (S32).

Further, appearance probabilities ($P_1$, $P_2$, ..., $P_n$) of the process conditions (conditions 1, 2, ..., n) are calculated. That is, the predicted probabilities at which the process conditions occur are calculated. For example, it is supposed that the process A is an exposure process of photolithography and a variation in the process parameter which is an exposure amount in the exposure process is $\Delta a_1$. If the distribution of exposure amount variations is normal distribution and a standard deviation is $\sigma$, the probability $P_{a1}$ with which the variation $\Delta a_1$ of the exposure amount occurs is expressed by the following equation.

$$P_{a1} = \frac{1}{\sqrt{2\pi}\,\sigma} \exp\left(-\frac{\Delta a_1^2}{\sigma^2}\right)$$

Likewise, in the cases of the other processes B, C and D, the probabilities $P_{b1}$, $P_{c1}$ and $P_{d1}$ with which the process variations $\Delta b_1$, $\Delta c_1$ and $\Delta d_1$ occur are calculated. The product ($P_{a1} \times P_{b1} \times P_{c1} \times P_{d1}$) of the thus calculated probabilities $P_{a1}$, $P_{b1}$, $P_{c1}$ and $P_{d1}$ is used as the appearance probability $P_1$ of the process condition 1 (S32).

Next, process simulation to predict a pattern to be formed on a wafer (semiconductor substrate) based on the provisional design pattern is performed for the respective process conditions (conditions 1, 2, ..., n) (S33). As a result, the pattern shapes on the wafer obtained by taking the process variations into consideration are predicted for the respective process conditions.

Then, whether or not the patterns predicted by performing the process simulation satisfy preset criteria are determined for the respective process conditions (conditions 1, 2, ..., n). That is, whether or not the shapes and dimensions of the patterns predicted by performing the process simulation satisfy preset criteria are determined (S34). For example, when all of the pattern widths satisfy the preset criteria, it is determined to be accepted. Further, when at least one of the pattern widths does not satisfy the preset criterion, it is determined to be rejected.

Next, the appearance probabilities of the process conditions used for the process simulation for the patterns which are determined not to satisfy the preset criteria are added together. Further, the addition result is divided by the total sum of the appearance probabilities of all of the process conditions (conditions 1, 2, ..., n). Thus, the defect probability D of the design pattern set at this time is calculated. That is, the defect probability D obtained when the pattern is formed on the wafer based on the provisional design pattern at this time is calculated. This is expressed as follows.

$$D = \sum_{i=1}^{n} \delta_i(x) \times P_i \bigg/ \sum_{i=1}^{n} P_i$$

However, in the acceptance/rejection determination process described above, when it is determined to be accepted, $\delta_i(x)$ is "0" and when it is determined to be rejected, $\delta_i(x)$ is "1" (S35, S36).

After the defect probability D is thus calculated, for example, the step as shown in FIG. 1 or 2 is performed. As a result, it becomes possible to determine a provisional design pattern which satisfies the preset requirement as a design pattern.

As described above, in the present embodiment, the appearance probabilities of the respective process conditions are acquired and the appearance probabilities of the process conditions which do not satisfy the preset criteria are added together to calculate the defect probability of the design pattern. Thus, it becomes possible to quantitatively and effectively determine the defect probability and efficiently correct the design pattern.

In the calculation method for the defect probability shown in FIG. 3, the acceptance/rejection determination process is performed based on the simulation result of the whole process, but it is possible to perform the acceptance/rejection determination process and perform the simulation for the individual processes.

Further, in the calculation method for the defect probability shown in FIG. 3, the defect probability caused by the process variation is calculated. If the defect probability caused by the process variation is set to Ds, the manufacturing yield Ys caused by the process variation is expressed as follows.

$Ys=1-Ds$

As another factor for determining the final yield of the semiconductor devices, dusts in the manufacturing process may be given. If the defect probability caused by the dusts is set to Dd, the manufacturing yield Yd caused by the dusts is expressed as follows.

$Yd=1-Dd$

The defect caused by the process variation and the defect caused by the dusts are independent events. Therefore, the final yield Y of the semiconductor devices is expressed as follows.

$$Y = Y_s \times Y_d = (1 - D_s) \times (1 - D_d)$$

Embodiment 2

Next, a second embodiment is explained. Since the basic items are the same as those of the first embodiment, the explanation for the items described in the first embodiment is omitted.

FIG. 4 is a flowchart showing a defect probability calculating method according to the present embodiment.

First, a provisional design pattern (provisional design data) which satisfies the design rule is created (S41).

Then, process simulation is performed in a preset condition for the provisional design pattern (S42). The preset condition is a condition containing the process variation and is a condition in which the pattern is made narrower or a condition in which the pattern is made wider, for example. The process simulation is performed in each condition to predict a pattern to be formed on the wafer (semiconductor substrate).

Next, a rejected portion in the provisional design pattern is specified based on the process simulation result to extract the thus specified rejected portion (S43). The size of an extracted area (cut-out area) is determined in order to enhance the calculation precision of process simulation which will be performed later. For example, in the simulation of the exposure process, it is desirable to approximately set several times the optical radius specified by the exposure process as the extracted area size. Further, in the simulation of the etching process, it is desirable to approximately set several times the mean free path as the extracted area size. The rejected portion extracted in the present step is a provisionally determined rejected portion and is a portion in which the preset criteria are likely to be not satisfied. Therefore, even if a portion is regarded as the rejected portion in the present step, there occurs a possibility that the portion is not regarded as a rejected portion in a step S46 which will be described later.

Next, the process which is the same as the process of the steps S32 to S36 shown in FIG. 3 of the first embodiment is performed for the design pattern (design data) of the extracted rejected portion (specified portion) (S44 to S48). As a result, like the case of the first embodiment, the defect probability D for the provisional design pattern is calculated.

As described above, in the present embodiment, like the first embodiment, it is possible to quantitatively and effectively determine the defect probability and efficiently correct the design pattern. Further, in the present embodiment, since the simulation may be performed for the specified portion (rejected portion) extracted from the design pattern, time required for the calculation can be greatly reduced.

In the example shown in FIG. 4, for simplicity of the explanation, the number of rejected portions extracted in the step S43 is set to one, but the method of the present embodiment can be applied to a case where a plurality of rejected portions are extracted.

Embodiment 3

Next, a third embodiment is explained. Since the basic items are the same as those of the first embodiment, the explanation for the items described in the first embodiment is omitted.

Figure 5:
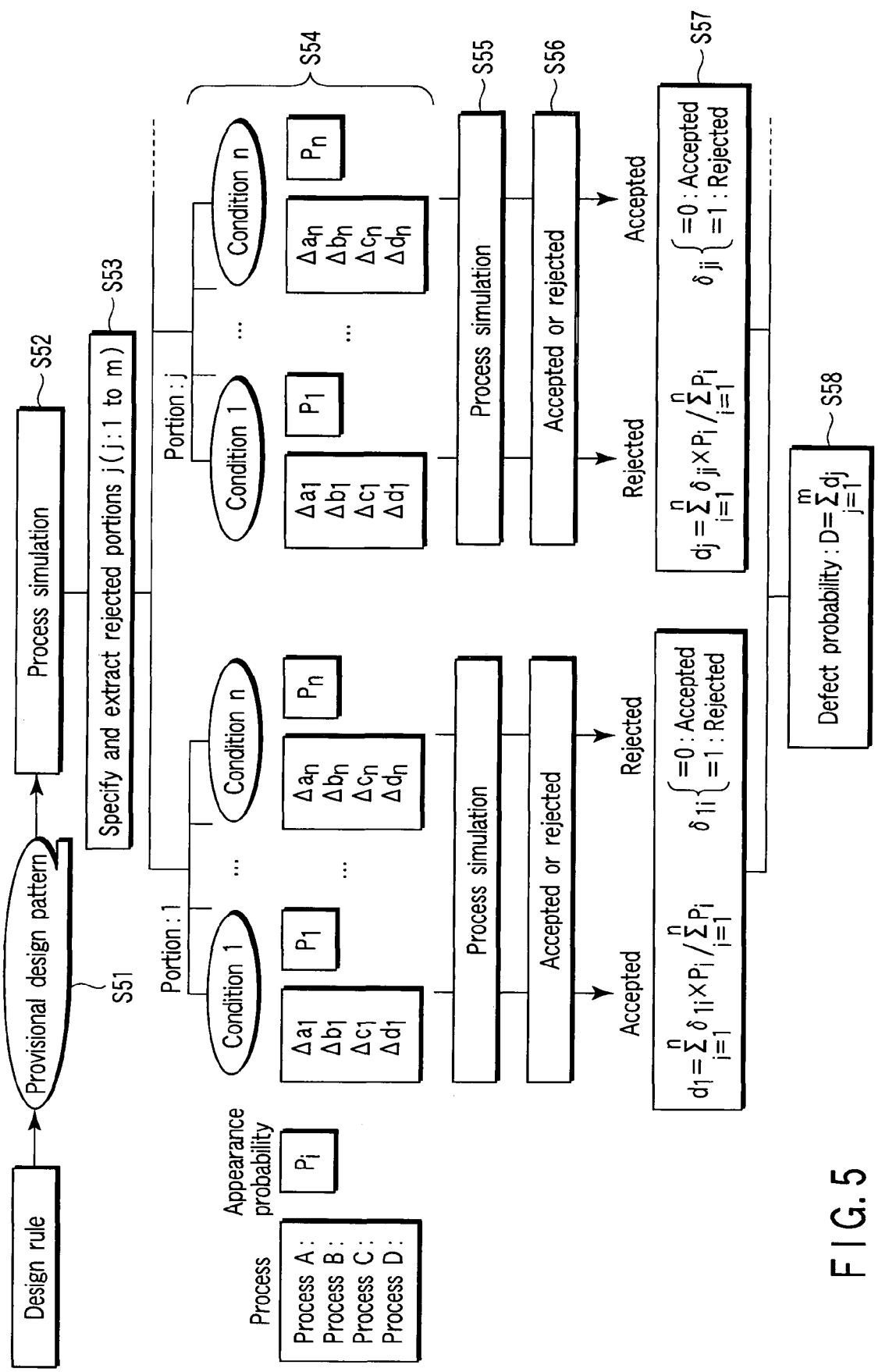
FIG. 5 is a flowchart showing a defect probability calculating method according to a third embodiment of this invention.

FIG. 5 is a flowchart showing a defect probability calculating method according to the present embodiment.

First, a provisional design pattern (provisional design data) which satisfies the design rule is created (S51). Then, like the second embodiment shown in FIG. 4, process simulation is performed in a preset condition for the provisional design pattern to predict a pattern to be formed on the wafer (semiconductor substrate) (S52).

Next, a plurality of rejected portions (rejected portions 1 to m) are specified in the provisional design pattern based on the process simulation result to extract the thus specified rejected portions 1 to m (S53). The size of an extracted area (cut-out area) is the same as that described in the second embodiment.

Next, the same process as the process of the steps S32 to S35 of FIG. 3 in the first embodiment is performed for the extracted rejected portions (specified portions) 1 to m (S54 to S57). As a result, individual defect probabilities $d_j$ (j: 1 to m) are respectively calculated for the specified portions 1 to m.

Then, the defect probability D for the provisional design pattern is calculated by adding together the individual defect probabilities $d_j$ (j: 1 to m) calculated for the respective specified portions (S58).

As described above, in the present embodiment, like the first embodiment, it becomes possible to quantitatively and effectively determine the defect probability and efficiently correct the design pattern. Further, in the present embodiment, since the simulation may be performed for the specified portions (rejected portions) extracted from the design pattern, time required for the calculation can be greatly reduced.

Further, in the present embodiment, the simulation is performed for each specified portion and the individual defect probability $d_j$ is calculated for each specified portion. Thus, since the specified portions are independently treated and calculated, the calculation is simplified and time required for the calculation can be greatly reduced. Further, when a plurality of unit cells of the same type are arranged in the design pattern, simulation may be performed only for one unit cell. Therefore, time required for the calculation can be greatly reduced from this viewpoint.

Embodiment 4

Next, a fourth embodiment is explained. Since the basic items are the same as those of the first embodiment, the explanation for the items described in the first embodiment is omitted.

FIG. 6 is a flowchart showing a defect probability calculating method according to the present embodiment.

First, a provisional design pattern (provisional design data) which satisfies the design rule is created (S61). Then, like the second embodiment shown in FIG. 4, process simulation is performed in a preset condition for the provisional design pattern to predict a pattern to be formed on the wafer (semiconductor substrate) (S62).

Next, a plurality of rejected portions (rejected portions 1 to m) are specified in the provisional design pattern based on the process simulation result to extract the thus specified rejected portions 1 to m (S63). The size of an extracted area (cut-out area) is the same as that described in the second embodiment.

Next, the process described below is respectively performed for the extracted rejected portions (specified portions) 1 to m.

First, a process variation caused in the process for creating a pattern on a wafer (semiconductor substrate) based on the design pattern is divided into first and second process variations. The first process variation is a variation caused by shifting of the central value (generally, an average value) of the pattern dimensions. The second process variation is a variation occurring when the pattern dimension varies depending on the pattern arrangement position. In the following description, the first process variation is referred to as a center shift variation and the second process variation is referred to as a local variation.

For example, the center shift variation is caused because the effective value of the process parameter is shifted by a variation with time or the like. For example, the local variation is caused because the value of the process parameter locally varies due to noises or the like. As one concrete example of the factors which cause the center shift variation, blurriness of the lens of the exposure apparatus can be given. As one concrete example of the factors which cause the local variation, noise occurring at the time of writing for formation of a photomask can be given.

In the present embodiment, a variation in the exposure amount and a variation in the focus position are assumed as the center shift variation. Further, process variations $\Delta a$ and $\Delta b$ caused by the exposure amount variation A and focus position variation B are assumed for the specified portions (rejected portions) 1 to m. Then, a plurality of process conditions (conditions 1, 2, ..., n) containing process variations are assumed for the specified portions 1 to m. Further, appearance probabilities ($P_1, P_2, \ldots, P_n$) of the process conditions (conditions 1, 2, ..., n) are calculated for the respective specified portions 1 to m. The concrete calculation method is the same as that of the first embodiment (S64).

Next, lithography simulation is performed for each of the process conditions (conditions 1, 2, ..., n) for the respective specified portions 1 to m. That is, lithography simulation to predict a photoresist pattern to be formed on a wafer (semiconductor substrate) based on the provisional design pattern is performed (S65).

By the above lithography simulation, the pattern dimension of the photoresist pattern to be formed by taking the process variations into consideration is predicted for each process condition for the respective specified portions 1 to m. That is, the pattern dimension $W_{ji}$ in the process condition i in the specified portion j is predicted (S66).

Next, the pattern dimension distribution caused by the local variation is calculated for the pattern (pattern dimension $W_{ji}$) predicted in the step S66. That is, the distribution of the pattern dimensions $W_{ji}$ caused by the local variations is predicted. Since the local variations are random variations in many cases, the dimension distribution can be expressed by use of normal distribution, for example. The distribution function of the dimension distribution can be expressed as follows.

Dimension distribution=$t(w, W_{ji})$ where w indicates the pattern dimension on the wafer with the local variation taken into consideration.

In the present embodiment, a variation in the photolithography is assumed as the center shift variation. Therefore, the pattern dimension $W_{ji}$ predicted in the step S66 is the dimension of the photoresist pattern. Generally, when the underlying layer is etched with the photoresist pattern used as a mask, a dimensional difference (conversion difference) occurs between the dimension of the photoresist pattern and the dimension of the underlying pattern formed by etching. When the conversion difference is set to Te, the dimension distribution is expressed as follows.

Dimension distribution=$t(w, W_{ji}-Te)$

Figure 7:
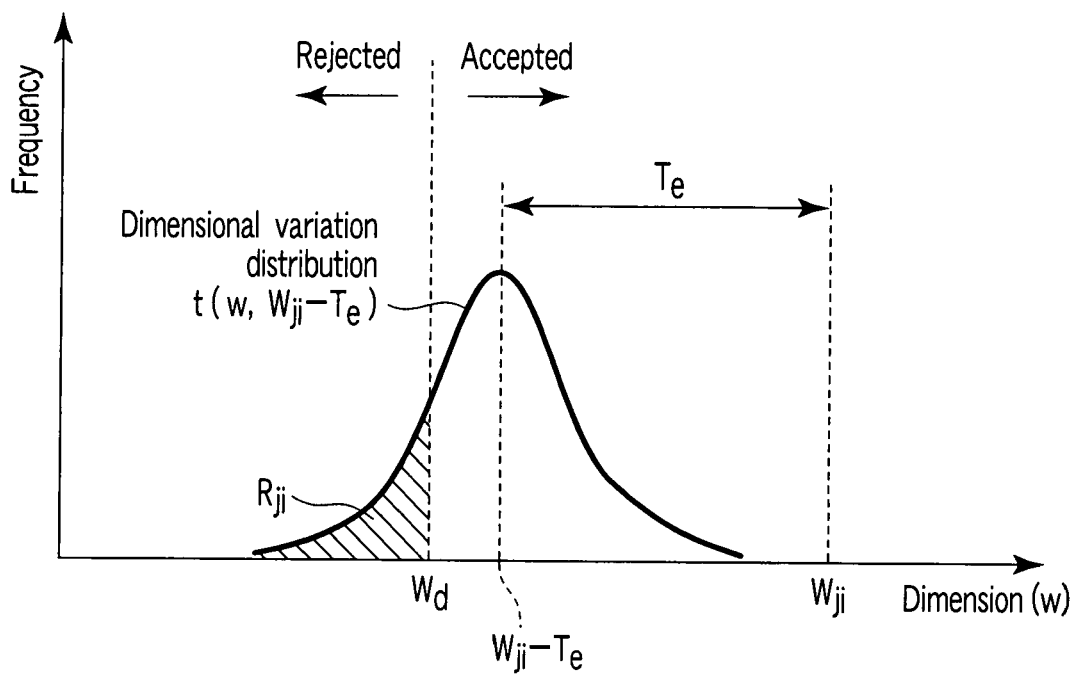
FIG. 7 is a diagram showing dimensional variation distribution in the fourth embodiment of this invention.

The dimension distribution (dimensional variation distribution) is shown in FIG. 7.

After the dimension distribution is thus obtained, the ratio $R_{ji}$ of a portion which does not satisfy the preset criteria in the dimensional distribution is obtained as follows. The dimensional criteria value used to determine whether the dimension of the underlying pattern satisfies the preset criteria is set to Wd. The ratio $R_{ji}$ in the specified portion j is expressed as follows.

$$R_{ji} = \int_0^{W_d} t(w, W_{ji} - Te)dw$$

In FIG. 7, a portion with the dimension smaller than the dimensional criteria value Wd corresponds to the ratio $R_{ji}$. That is, the probability that the dimension of the underlying pattern is rejected in the specified portion j in the process condition i is calculated as the ratio $R_{ji}$.

Next, the product of the appearance probability $P_i$ of the process condition i and the ratio $R_{ji}$ is obtained for each process condition i. Then, the products obtained for the respective process conditions are added together. Further, the result of addition is divided by the sum of the appearance probabilities of all of the process conditions (process conditions 1, 2, ..., n). As a result, the individual defect probability $d_j$ of the specified portion j is calculated. This is expressed by the following equation (S67).

$$d_j = \left(\sum_{i=1}^n P_i \int_0^{W_d} t(w, W_{ji} - Te)dw\right) \bigg/ \sum_{i=1}^n P_i$$

After this, the defect probability D for the provisional design pattern is calculated by adding together the individual defect probabilities $d_j$ (j: 1 to m) calculated for the respective specified portions (S68).

In this case, $d_j$ and D thus obtained are approximate expressions and obtained as follows. If the manufacturing yield caused by the process variations is set to Ys, Ys can be expressed as follows by use of $R_{ji}$.

$$Y_s = \sum_{i=1}^n \left\{P_i \prod_{j=1}^m (1 - R_{ji})\right\} \bigg/ \sum_{i=1}^n P_i$$

In the above equation, $R_{ji}$ indicates the defect probability in the specified portion j in the process condition i and $(1-R_{ji})$ indicates the acceptance possibility (probability). Since the acceptance possibility of a semiconductor device is attained by preventing defects from occurring in all of the specified portions, the multiplication of $(1-R_{ji})$ for the specified portions j (j: 1 to m) is obtained. Since the result of multiplication indicates the acceptance possibility in the process condition i, the product of the multiplication result and the appearance probability $P_i$ of the process condition i is obtained. Further, the manufacturing yield Ys is obtained by performing the normalization process.

When it is supposed that the value of $R_{ji}$ is small in the above equation, the approximate expression Ys' can be expressed as follows.

$$Ys' = \sum_{i=1}^{n}\left\{P_i\left[1-\sum_{j=1}^{m}R_{ji}\right]\right\}\bigg/\sum_{i=1}^{n}P_i$$

$$= 1 - \sum_{i=1}^{n}\sum_{j=1}^{m}P_i R_{ji}\bigg/\sum_{i=1}^{n}P_i$$

$$= 1 - \sum_{j=1}^{m}d_j$$

$$= 1 - D$$

By thus using the approximate expression, the specified portion can be independently treated.

As described above, in the present embodiment, like the first embodiment, it becomes possible to quantitatively and effectively determine the defect probability and efficiently correct the design pattern. Further, in the present embodiment, since the simulation may be performed for the specified portion (rejected portion) extracted from the design pattern like the cases of the second and third embodiments, time required for the calculation can be greatly reduced.

Further, in the present embodiment, the process variation is divided into the center shift variation and local variation. The simulation is performed for the center shift variation and the distribution of local variations is reflected on the simulation result. Therefore, the simulation is performed only for the center shift variation. Thus, time required for the calculation can be greatly reduced from this viewpoint.

In the above embodiment, the focus position variation and exposure amount variation in the photolithography are assumed as the center shift variation. Generally, the pattern dimension linearly varies with an exposure amount. Therefore, in a case where three or more combinations in which only the exposure amount varies with the focus position kept constant are provided as the process condition, the simulation may be performed only for the two process conditions in which the exposure amounts are significantly different and the pattern dimension may be calculated by linear approximation based on the two pattern dimensions obtained by the simulation for the other process conditions. Thus, time required for the calculation of simulation can be further reduced.

The methods described in the first to fourth embodiments can be realized by use of a computer whose operation is controlled according to a program in which the procedure of the above method is described. The program can be provided by use of a communication line (wired line or wireless line) such as Internet or a recording medium such as a magnetic disk.

Embodiment 5

Next, a fifth embodiment is explained. The explanation for the items described in the first to fourth embodiments is omitted.

Figure 8:
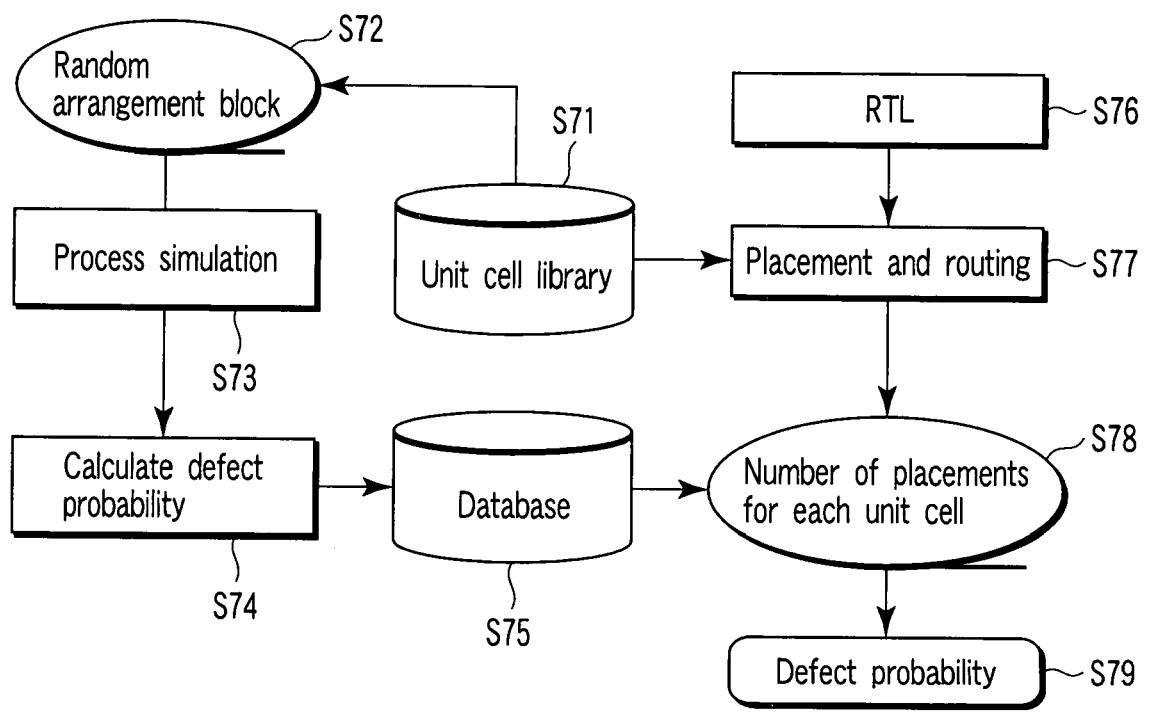
FIG. 8 is a flowchart showing a method according to a fifth embodiment of this invention.

FIG. 8 is a flowchart showing a method according to the present embodiment.

First, a unit cell library containing plural kinds of unit cells is prepared (S71) and the unit cells are arranged in a random arrangement block (S72).

Next, process simulation is performed (S73) and defect probability is calculated for each unit cell (S74). The process simulation and defect probability calculating operations can be attained by use of the methods described in the first to fourth embodiments. For example, assume that two rejected portions (specified portions) are contained in a unit cell A and the defect probabilities thereof are respectively set to $d_{a1}$ and $d_{a2}$. In this case, the defect probability of the unit cell A becomes ($d_{a1}+d_{a2}$). Further, assume that two rejected portions (specified portions) are also contained in a unit cell B and the defect probabilities thereof are respectively set to $d_{b1}$ and $d_{b2}$. In the unit cell B, it is supposed that the rejected portion is influenced by the other cells arranged in the surrounding area and the defect probability varies by the influence of the other cells. If the degrees of influence of the other cells are respectively set to $q_{b1}$ and $q_{b2}$, the defect probability of the unit cell B becomes ($q_{b1} \times d_{b1} + q_{b2} \times d_{b2}$). The defect probability of each unit cell thus obtained is stored as a database (S75).

When a desired integrated circuit chip is formed, the defect probability of the integrated circuit chip can be calculated by referring to the database. Specifically, the operation is performed as follows. First, an RTL (register transfer level) which is design circuit information of the desired integrated circuit chip is prepared (S76) and a design pattern of the integrated circuit chip is created by use of a placement and routing tool (S77). Then, the number of unit cells contained in the design pattern of the integrated circuit chip is obtained for the respective kinds of unit cells (S78). After this, the product of the defect probability and the number of cells is calculated for each kind of the unit cells by referring to the database formed in the step S75. Further, the defect probability of the desired integrated circuit chip is calculated by adding together the calculated products (S79).

As described above, according to the present embodiment, the defect probability of the desired integrated circuit chip can be easily calculated by previously calculating the defect probability for each unit cell.

Embodiment 6

Next, a sixth embodiment is explained. In the present embodiment, the manufacturing yield of integrated circuit chips is calculated based on the defect probability of the integrated circuit chip obtained by use of the method of the fifth embodiment. Then, the product input number and the unit price of the integrated circuit chips are determined based on the calculated yield.

Figure 9:
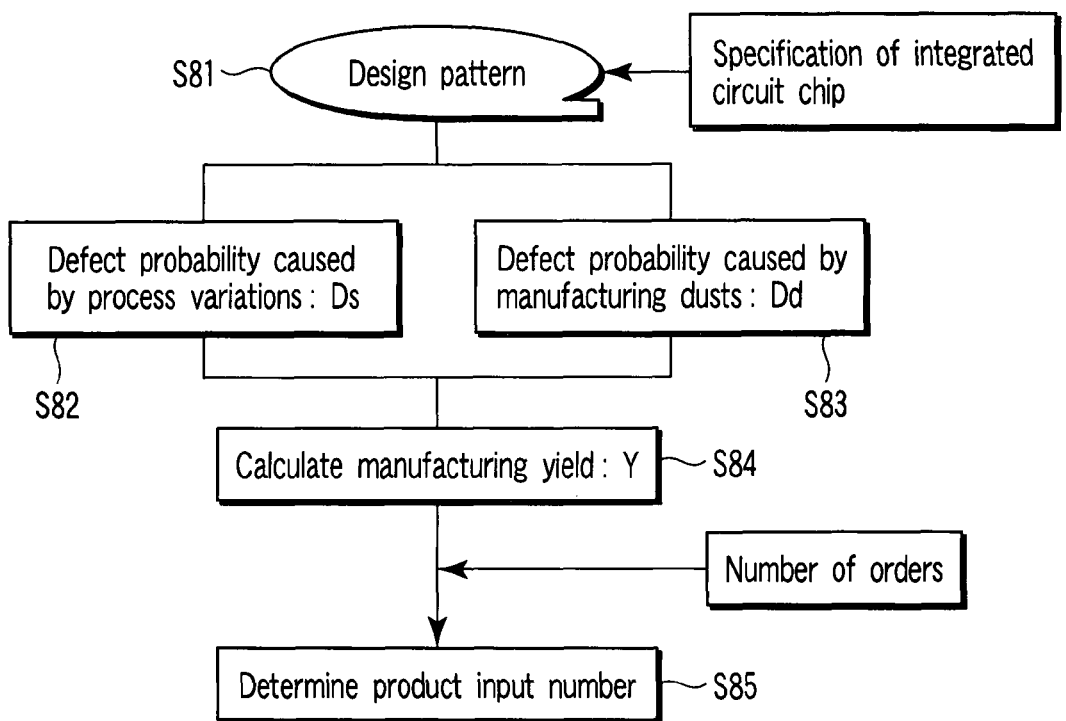
FIG. 9 is a flowchart showing a method for determining the product input number of integrated circuit chips according to a sixth embodiment of this invention.

FIG. 9 is a flowchart showing a method for determining the product input number of integrated circuit chips.

First, a design pattern is created based on the specification of an integrated circuit chip (S81). Then, defect probability Ds caused by the process variation is calculated based on the created design pattern. The defect probability Ds is defect probability calculated by use of the method of the fifth embodiment (S82). As is already described before, as another factor of determining the final yield of the integrated circuit chip, dusts occurring in the manufacturing process are provided. Therefore, defect probability Dd caused by the manufacturing dusts is also calculated (S83).

Next, the manufacturing yield of the integrated circuit chips is calculated based on the defect probabilities Ds and Dd calculated in the steps S82 and S83. If the manufacturing yield caused by the process variation is set to Ys and the manufacturing yield caused by the manufacturing dusts is set to Yd, the final yield Y of the integrated circuit chips is obtained as follows (S84).

$$Y = Ys \times Yd = (1-Ds) \times (1-Dd)$$

Next, the product input number of the integrated circuit chips is determined based on the manufacturing yield of the integrated circuit chips and the number of orders of the integrated circuit chips (S85).

Thus, according to the above method, the manufacturing yield is calculated based on the defect probability of the integrated circuit chips and the product input number of the integrated circuit chips is calculated based on the calculation result of the manufacturing yield. Therefore, the product input number can be precisely determined. Thus, the number of product which is approximately equal to the number of orders can be attained without fail.

Figure 10:
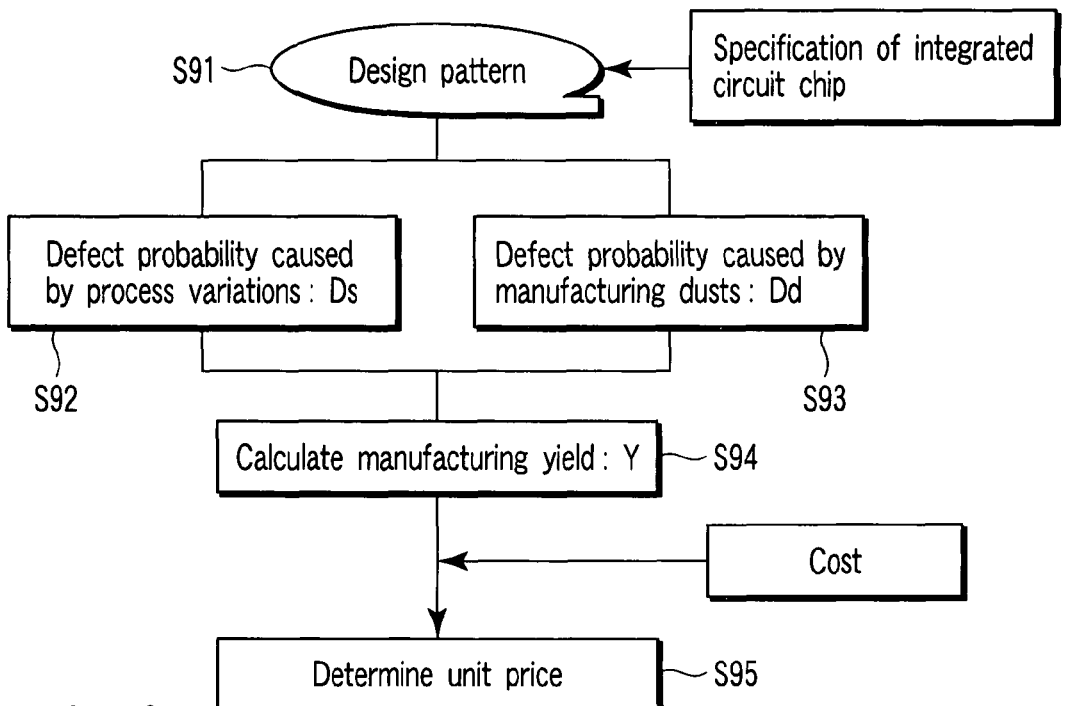
FIG. 10 is a flowchart showing a method for determining the unit price of an integrated circuit chip according to the sixth embodiment of this invention.

FIG. 10 is a flowchart showing a method for determining the unit price of an integrated circuit chip.

First, the manufacturing yield Y of the integrated circuit chips is calculated by performing the steps S91 to S94 like the case of the steps S81 to S84 of FIG. 9.

Then, the unit price of the integrated circuit chip is determined based on the cost determined by the manufacturing yield of the integrated circuit chips and a factor other than the manufacturing yield of the integrated circuit chips (S95).

Thus, according to the above method, the manufacturing yield is calculated based on the defect probability of the integrated circuit chip and the unit price of the integrated circuit chip is calculated based on the calculation result of the manufacturing yield. Therefore, the unit price of the integrated circuit chip can be precisely determined. Thus, the unit price of the integrated circuit chip can be precisely determined at the stage before the integrated circuit chips are manufactured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A defect probability calculating method comprising:
assuming a plurality of process conditions containing process variations caused in a process of forming a pattern on a substrate based on a design pattern;
acquiring appearance probabilities of the respective process conditions;
performing process simulation to predict a pattern to be formed on a substrate based on the design pattern for each of the process conditions;
determining whether the pattern predicted by performing the process simulation satisfies preset criteria for each of the process conditions; and
acquiring first probability by adding together appearance probabilities of the process conditions used for process simulation of patterns which are determined not to satisfy the preset criteria.

2. The method according to claim 1, wherein a process from said assuming the plurality of process conditions to said acquiring the first probability is performed for a specified portion extracted from the design pattern.

3. The method according to claim 2, wherein the specified portion is a provisionally rejected portion which is determined by previously performing process simulation for the design pattern.

4. The method according to claim 1, wherein a process from said assuming the plurality of process conditions to said acquiring the first probability is performed for each of a plurality of specified portions extracted from the design pattern, and
wherein the method further comprises one of first and second processes,
the first process comprising: adding together the first probabilities acquired for the respective specified portions,
the second process comprising: calculating a first value by subtracting the first probability from unity for each of the specified portions; calculating a second value by multiplying together the first values calculated for the respective specified portions; and subtracting the second value from unity.

5. The method according to claim 4, wherein the specified portion is a provisionally rejected portion which is determined by previously performing process simulation for the design pattern.

6. The method according to claim 1, wherein the process includes at least one of a photolithography process and etching process.

7. The method according to claim 1, wherein a process from said assuming the plurality of process conditions to said acquiring the first probability is performed for each of plural kinds of unit cells, and
wherein the method further comprises one of first and second processes,
the first process comprising:
acquiring the number of unit cells contained in a design pattern of a desired integrated circuit chip for each kind of unit cells;
calculating a product of the first probability and the number of unit cells for each kind of unit cells; and
calculating defect probability of the desired integrated circuit chip by adding together the products calculated for the respective kinds of unit cells,
the second process comprising:
acquiring the number of unit cells contained in a design pattern of a desired integrated circuit chip for each kind of unit cells;
calculating a first value by subtracting the first probability from unity for each kind of unit cells;
calculating a second value by multiplying the first value by itself by a number of times corresponding to the number of unit cells for each kind of unit cells;
calculating a third value by multiplying together the second values calculated for the respective kinds of unit cells; and
calculating defect probability of the desired integrated circuit chip by subtracting the third value from unity.

8. A defect probability calculating method comprising:
dividing process variations occurring in a process of forming a pattern on a substrate based on a design pattern into a first process variation in which a central value of pattern dimensions shifts and a second process variation in which a pattern dimension varies depending on a pattern arrangement position;
assuming a plurality of process conditions containing the first process variations;
acquiring appearance probabilities of the respective process conditions;
performing process simulation for each of the process conditions with respect to the design pattern to predict a preset pattern;
acquiring a ratio at which the preset pattern predicted for each of the process conditions does not satisfy a preset dimensional condition due to the second process variation;

acquiring a product of the appearance probability and the ratio for each of the process conditions; and acquiring first probability by adding together the products acquired for the respective process conditions.

9. The method according to claim 8, wherein said acquiring the ratio at which the preset pattern does not satisfy the preset dimensional condition includes predicting dimensional distribution of the preset pattern caused by the second process variation, and acquiring a ratio of a portion which does not satisfy preset criteria in the dimensional distribution.

10. The method according to claim 8, wherein a process from said dividing the process variations into the first process variation and the second process variation to said acquiring the first probability is performed for a specified portion extracted from the design pattern.

11. The method according to claim 10, wherein the specified portion is a provisionally rejected portion which is determined by previously performing process simulation for the design pattern.

12. The method according to claim 8, wherein a process from said dividing the process variations into the first process variation and the second process variation to said acquiring the first probability is performed for each of a plurality of specified portions extracted from the design pattern, and wherein the method further comprises one of first and second processes, the first process comprising: adding together the first probabilities acquired for the respective specified portions, the second process comprising: calculating a first value by subtracting the first probability from unity for each of the specified portions; calculating a second value by multiplying together the first values calculated for the respective specified portions; and subtracting the second value from unity.

13. The method according to claim 12, wherein the specified portion is a provisionally rejected portion which is determined by previously performing process simulation for the design pattern.

14. The method according to claim 8, wherein the first process variation is based on a variation in a process parameter with time.

15. The method according to claim 8, wherein the second process variation is based on a local variation of a process parameter caused by noise.

16. The method according to claim 8, wherein the preset pattern is a photoresist pattern.

17. The method according to claim 8, wherein a process from said dividing the process variations into the first process variation and the second process variation to said acquiring the first probability is performed for each of plural kinds of unit cells, and wherein the method further comprises one of first and second processes, the first process comprising:

acquiring the number of unit cells contained in a design pattern of a desired integrated circuit chip for each kind of unit cells;

calculating a product of the first probability and the number of unit cells for each kind of unit cells; and calculating defect probability of the desired integrated circuit chip by adding together the products calculated for the respective kinds of unit cells, the second process comprising:

acquiring the number of unit cells contained in a design pattern of a desired integrated circuit chip for each kind of unit cells;

calculating a first value by subtracting the first probability from unity for each kind of unit cells;

calculating a second value by multiplying the first value by itself by a number of times corresponding to the number of unit cells for each kind of unit cells;

calculating a third value by multiplying together the second values calculated for the respective kinds of unit cells; and calculating defect probability of the desired integrated circuit chip by subtracting the third value from unity.

* * * * *